(12) United States Patent
Sheu et al.

(10) Patent No.: US 7,643,373 B2
(45) Date of Patent: Jan. 5, 2010

(54) DRIVING METHOD AND SYSTEM FOR A PHASE CHANGE MEMORY

(76) Inventors: Shyh-Shyuan Sheu, No. 14, Lane 307, Sec. 3, Sanmin Rd North District, Taichung City (TW) 404; Lieh-Chiu Lin, No. 31, Lane 258, Jhongsiao 1st Rd, Sinsing District, Kaohsiung City (TW) 800; Pei-Chia Chiang, 3F., No. 4, Lane 535, Fujin St, Songshan District, Taipei City (TW) 105; Wen-Han Wang, No. 3, Alley 2, Lane 113, Minzu Rd, Hsinchu City (TW) 300

( * ) Notice: Subject to any disclaimer, the term of this patent is extended or adjusted under 35 U.S.C. 154(b) by 0 days.

(21) Appl. No.: 11/944,388

(22) Filed: Nov. 21, 2007

(65) Prior Publication Data
US 2008/0170431 A1 Jul. 17, 2008

(30) Foreign Application Priority Data
Jan. 12, 2007 (TW) .............................. 96101233 A

(51) Int. Cl.
*G11C 8/00* (2006.01)
(52) U.S. Cl. ................. 365/236; 365/222; 365/230.03; 365/189.04
(58) Field of Classification Search ................. 365/222, 365/236, 230.03, 189.04
See application file for complete search history.

(56) References Cited

U.S. PATENT DOCUMENTS

| | | | |
|---|---|---|---|
| 5,761,703 A | 6/1998 | Bolyn | |
| 5,907,863 A | 5/1999 | Bolyn | |
| 6,570,784 B2 | 5/2003 | Lowrey | |
| 6,614,704 B2 | 9/2003 | Dobler et al. | |
| 6,914,801 B2 | 7/2005 | Kostylev et al. | |
| 2001/0040833 A1 | 11/2001 | Bogin et al. | |
| 2006/0056251 A1* | 3/2006 | Parkinson | 365/202 |
| 2008/0117663 A1* | 5/2008 | Philipp et al. | 365/148 |

FOREIGN PATENT DOCUMENTS

| TW | 574692 | 2/2004 |
|---|---|---|
| TW | I222644 | 10/2004 |

* cited by examiner

*Primary Examiner*—Thong Q Le
(74) *Attorney, Agent, or Firm*—Quintero Law Office

(57) ABSTRACT

An embodiment of a method for driving a phase change memory, comprising counting an access number of a phase change memory, wherein the access number is the number of times that the phase change memory has been accessed; refreshing the phase change memory when the number of times is large than a predetermined number.

22 Claims, 4 Drawing Sheets

DRIVING METHOD AND SYSTEM FOR A PHASE CHANGE MEMORY

BACKGROUND OF THE INVENTION

1. Field of the Invention

The present invention relates to a phase change memory, and particularly to a driving method and system for the phase change memory.

2. Description of the Related Art

With the growth in the use of portable electronic devices, the demand for non-volatile memory has increased. Among the various kinds of non-volatile memory, phase change memory is the most competitive next generation non-volatile memory due to its higher speed, lower power consumption, higher capacity, reliability, easier process integration and lower cost. By inputting specific current pulses, the material of the phase change memory can change quickly between two states. The phase change material changes its state only when receiving the specific current pulses and will not change its state when the input energy is discontinued. At present, Chalcogenide material is a popular and widely used phase change material used in modern phase change memory technology, wherein $Ge_2Sb_2Te_5$ is the most popular. The material is also widely used in rewritable compact discs (CD-RW) and rewritable digital video discs (DVD-RW).

Phase change material in a phase change memory devices undergo at least two solid phases, a crystalline state and an amorphous state. Transformation between these two phases can be achieved by changing the temperature of the phase change material, wherein the temperature can be changed by specific current pulses or voltage pulses. The phase change material exhibits different electrical characteristics depending on its state. However, if the phase change material is incompletely crystallized (set), the resistance of the phase change material at the crystalline state is not sufficiently reduced, and therefore the range of the sensing margin is reduced. The general solution for the described problem is to increase the duration of the set current pulse or input a current pulse with high magnitude and short duration before the set operation. However, this uses more power and may decrease access speed of the phase change memory.

A novel phase change memory development technique, is to reduce the size of the phase change memory cell. When the size of the phase memory cell is reduced, the operating voltage of the phase change memory reduces and the conduction lines inside the phased change memory also becomes thinner. If the conduction line becomes thinner, the current carried in the conduction line also reduces. Furthermore, extra current pulse with high magnitude and short duration also increases the complexity of driving circuit design.

BRIEF SUMMARY OF THE INVENTION

An embodiment of the invention provides a method for driving a phase change memory, comprising counting an access number of a phase change memory, wherein the access number is the number of times that the phase change memory has been accessed; and refreshing the phase change memory when the number of times is large than a predetermined number.

Another embodiment of the invention provides a driving method for a phase change memory comprising a plurality of memory blocks, wherein the method comprises selecting a memory block; counting an access number of the selected memory block; labeling the selected memory block and refreshing the selected memory block at a specific time when the access number exceeds a predetermined number.

Another embodiment of the invention provides a phase change memory writing system comprising a phase change memory, a spare memory, a memory controller and a counter. The counter counts an access number of a phase change memory, wherein the access number is the number of times that the phase change memory has been accessed, and when the number of times is large than a predetermined number, a memory refresh procedure is applied to the phase change memory. The procedure comprises copying and storing the data of the phase change memory to the spare memory; inputting a reset current to the phase change memory; copying and storing the data from the spare memory to the phase change memory.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
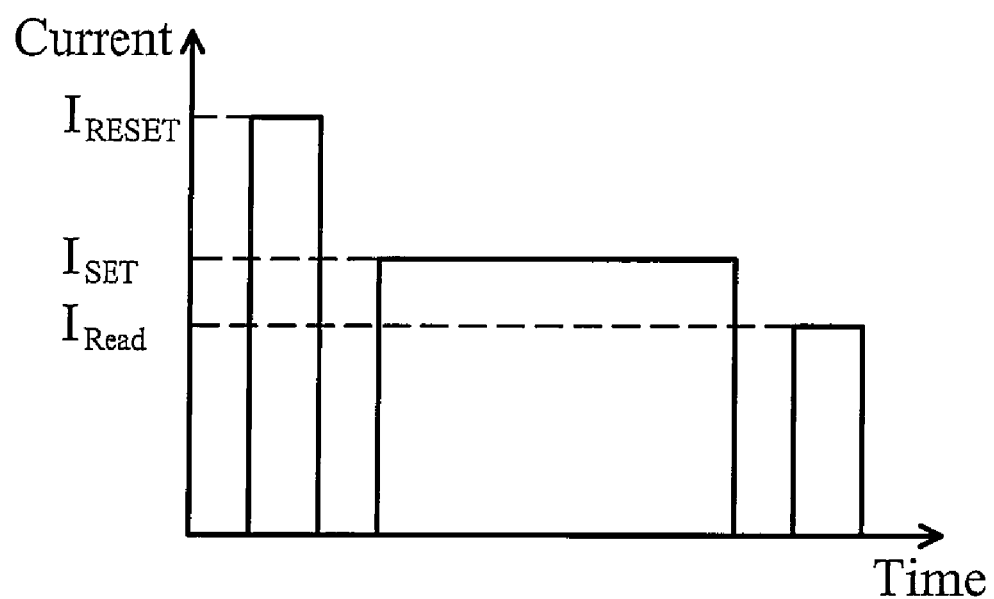
FIG. 1 is a schematic diagram showing the writing current pulse and the reading current pulse of the phase change memory.

The operations of the phase change memory are mainly achieved by inputting two current pulses with different current magnitudes to the phase change memory to switch the phase change memory between an amorphous state and a crystalline state. According to Ohm-Joule's Law, when the current is input to the phase change memory, the phase change memory is heated. The phase change memory may thus be crystallized or melted based on different currents. Based on the described illustration, the logic state of the phase change memory can be transformed by inputting different currents, and this enables data storage. FIG. 1 is a schematic diagram showing the writing current pulse and the reading current pulse of the phase change memory. When a RESET operation is applied to the phase change memory, a reset current $I_{RESET}$ with high amplitude and short pulse width is applied, the phase change memory is thus melted because the temperature of the phase change memory exceeds the melting temperature, $T_m$, of the phase change material of the phase change memory. When the temperature of the phase change memory decreases, the state of the phase change memory is transformed to the amorphous state due to the insufficient cool down period. Thus the phase change memory has high resistance. When a SET operation is applied to the phase change memory, a set current $I_{SET}$ with lower amplitude and longer pulse width is applied. The phase change memory is heated by the set current $I_{SET}$, and the temperature of the phase change memory is held substantially between the melting temperature $T_m$ and a crystallizing temperature $T_c$ of the phase change material used by the phase change memory. During the SET operation, the melted phase change memory has sufficient time for crystallizing and the phase change memory thus has low resistance.

As described, the phase change memory respectively stores data with logic state 1 and 0 by the RESET operation and the SET operation. When reading the phase change memory, a read current $I_{READ}$ the amplitude of which is less than the set current $I_{SET}$, is applied to the phase change memory to determine the logic state of the data stored in the phase change memory.

Figure 2:
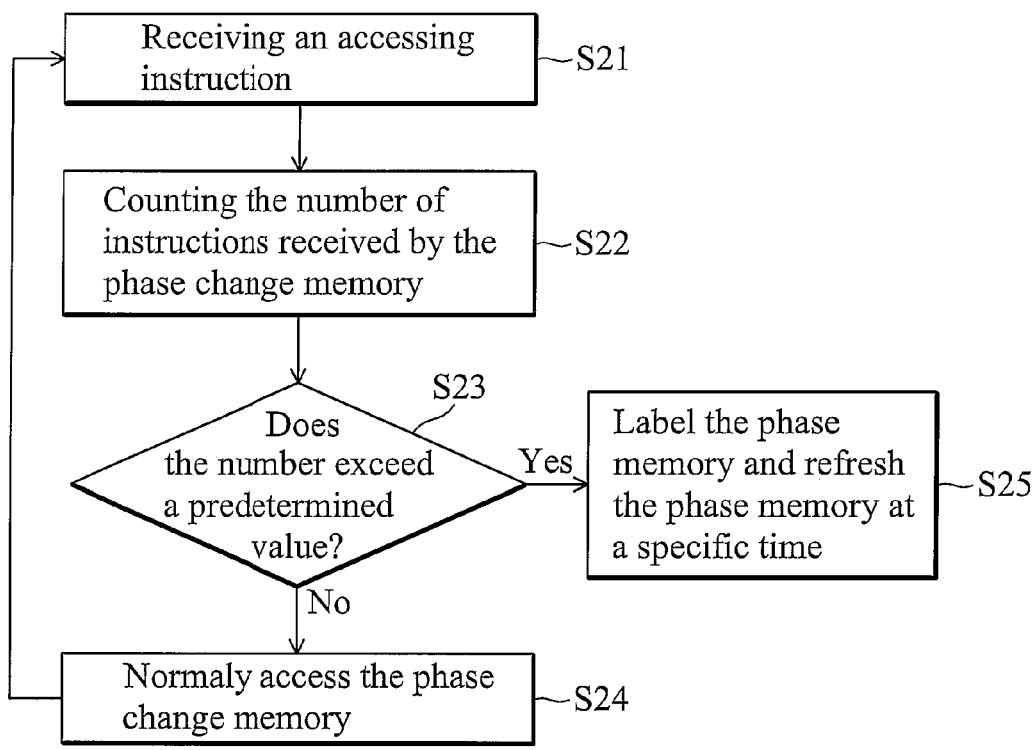
FIG. 2 is a flow chart of a phase change memory writing method according to an embodiment of the invention.

FIG. 2 is a flow chart of a phase change memory writing method according to an embodiment of the invention. In step S21, when the phase change memory detects and receives an access instruction, a counter is applied to count an access number of the phase change memory in step S22, wherein the access number is the number of times that the phase change memory has been accessed. In this embodiment, the counter can be implemented by software or hardware, and may be embedded in a memory controller or built in an external peripheral circuit. In one embodiment, the phase change memory can be divided into a plurality memory blocks, and each memory block is coupled to an individual counter for counting the access number for individual memory block. In this embodiment, the access number comprises a reset number, a set number or a read number. The phase change memory writing method can be processed based on only the set number, the reset number, the read number or the combination thereof. In step S23, a memory controller determines whether the access number exceeds a predetermined value. If not, the procedure jumps to the step S24, and the phase change is normally accessed. If the access number exceeds the predetermined value, the procedure jumps to the step S25. In the step S25, the phase change memory is labeled and a memory refresh procedure is applied to the phase change memory at a specific time. According to the described operation, the phase change memory can avoid over-writing due to successive SET or RESET operations. In this embodiment, if the access number is only for a specific memory block, the memory refresh procedure is applied only to the specific memory block. In this embodiment, the memory refresh procedure can be applied when the labeled memory is in an idle mode or before the labeled memory is accessed. In another embodiment, the memory refresh procedure can be applied when the labeled memory is activated from a sleeping mode. Furthermore, the memory refresh procedure can be applied as an initial procedure when an electronic device using the memory is turned on.

Figure 3:
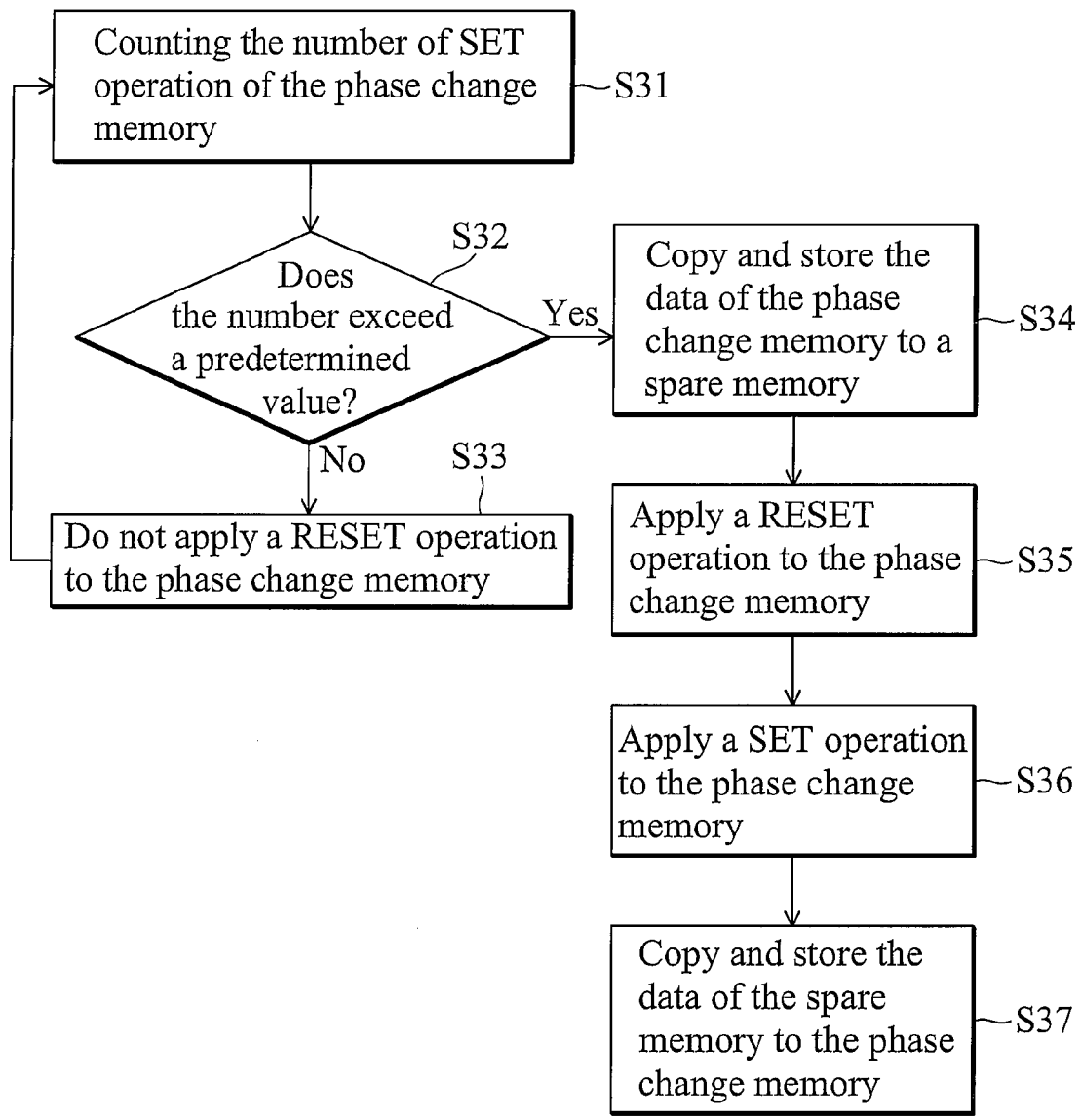
FIG. 3 is a flow chart of a memory refresh procedure according to an embodiment of the invention.

FIG. 3 is a flow chart of a memory refresh procedure according to an embodiment of the invention. The memory refresh procedure of the embodiment avoids the phase change memory from becoming over-crystallized. In other words, the memory refresh procedure of the embodiment is applied based on the set number, wherein the set number is the number of times that the phase change memory has been set. In step S31, a counter is applied to count the set number of the phase change memory. In step S32, a memory controller is applied to determine whether the set number exceeds a predetermined value. If not, the procedure jumps to step S33, and the phase change is normally accessed. If the access number exceeds the predetermined value, the procedure jumps to the step S34. In the step S34, the data of the phase change memory is copied and temporally stored in spare memory. In this embodiment, the spare memory may be an external memory or at least one memory block of the phase change memory, in other words, the phase change memory can be divided into a plurality of memory blocks and part of the memory blocks is used as the spare memory. In the step S35, a reset operation is applied to the phase change memory. In other words, a reset current with shorter pulse width and higher magnitude is input to the phase change memory, and therefore the phase change memory is transformed to the amorphous state. In the step S36, a set operation is then applied to the phase change memory. In other words, a set current with longer pulse width and lower magnitude is input to the phase change memory, and therefore the phase change is transformed to the crystalline state. In the step S37, the data stored in the spare memory is written back to the phase change memory. In one embodiment, the step S36 can be skipped, and after the step S35 finishes, the data stored in the spare memory is written back to the phase change memory.

Figure 4:
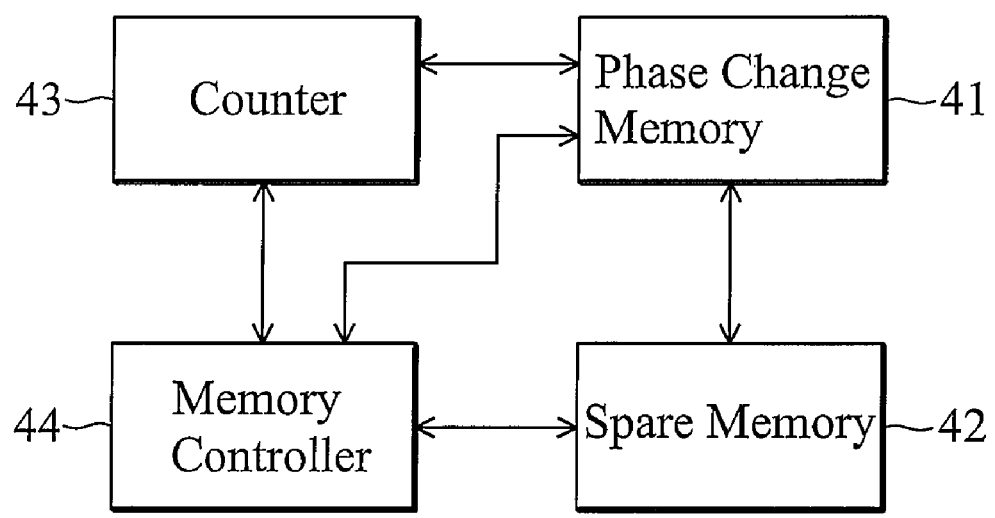
FIG. 4 is a schematic diagram of a phase change memory writing system according to an embodiment of the invention.

FIG. 4 is a schematic diagram of a phase change memory writing system according to an embodiment of the invention. The phase change memory 41 comprises a plurality of memory blocks and each memory block is coupled to a corresponding counting unit of the counter 43. The memory controller 44 determines whether the phase change memory 41 requires a memory refresh operation based on the counting result of the counter 43. When the counter 43 detects that the access number of the phase change memory 41 exceeds a predetermined value, the counter 43 outputs a control signal to the memory controller 44. The memory controller 44 processes a memory refresh operation to the phase change memory 41 based on the control signal. Before the memory refresh operation, the memory controller 44 copies and stores the data of the phase change memory 41 to a spare memory 42. In this embodiment, the spare memory 42 may be an external memory, a dynamic random access memory (DRAM), a static random access memory (SRAM) or at least one specific memory block of the phase change memory 41, in other words, the part of the memory blocks of the phase change memory 41 is programmed as the spare memory 42. After the data of the phase change memory 41 is stored in the spare memory 42, a memory refresh operation is applied to the phase change memory 41 by the memory controller 44, wherein the operation comprises the following three steps. In the first step, a reset operation, a set operation or both the reset operation and set operation is applied to the phase change memory 41 to maintain the phase change memory at the amorphous state and the crystalline state. In the second step, a set operation or a reset operation is applied to the phase change memory 41 by the memory controller 44. It is notice that the operation in the first step is different from the operation in the second step. In other words, the memory controller 44 applies a successive set operation and reset operation to avoid the phase change memory 41 from becoming over-crystallized or over-amorphous. In the third step, the data stored in the spare memory 42 is written back to the phase change memory 41 to finish the memory refresh operation.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for driving a phase change memory, comprising:
   counting an access number of a phase change memory, wherein the access number is the number of times that the phase change memory has been accessed and the access number comprises a combination of a reset number, a set number and a read number; and
   refreshing the phase change memory when the access number is large than a predetermined number.

2. The method as claimed in claim 1, wherein when the set number is larger than the predetermined number, a reset procedure is applied to the phase change memory first, and then a set procedure is applied to the phase change memory.

3. The method as claimed in claim 2, wherein the reset procedure comprises inputting a reset current to the phase change memory.

4. The method as claimed in claim 2, wherein the set procedure comprises inputting a set current to the phase change memory.

5. The method as claimed in claim 2, wherein the data stored in the phase change memory is transmitted and stored in a spare memory before the reset procedure is applied to the phase change memory.

6. The method as claimed in claim 1, wherein when the phase change memory is refreshed, the access number is set to 0.

7. The method as claimed in claim 1, wherein the operation of refreshing the phase change memory comprises:
   copying and storing the data of the phase change memory to a spare memory;
   inputting a reset current to the phase change memory; and
   copying and storing the data from the spare memory to the phase change memory.

8. The method as claimed in claim 7, further comprising inputting a set current to the phase change memory.

9. A driving method for a phase change memory comprising a plurality of memory blocks, comprising:
   selecting a memory block;
   counting an access number of the selected memory block; and
   labeling the selected memory block and refreshing the selected memory block at a specific time when the access number exceeds a predetermined number, wherein the access number comprises a combination of a reset number, a set number and a read number.

10. The method as claimed in claim 9, wherein when the set number is larger than the predetermined number, a reset procedure is applied to the phase change memory first, and then a set procedure is applied to the phase change memory.

11. The method as claimed in claim 10, wherein the data of the memory block is stored at another memory block before the selected memory block is refreshed.

12. The method as claimed in claim 9, further comprising:
   setting the access number to zero after the selected memory block is refreshed.

13. The method as claimed in claim 9, further comprising:
   copying and storing the data of the selected memory block to a spare memory block;
   inputting a reset current to the phase change memory; and
   copying and storing the data from the spare memory block to the selected memory block.

14. The method as claimed in claim 13, further comprising:
   inputting a set current to the selected memory block.

15. The method as claimed in claim 9, wherein the specific time is the time that the selected memory block is in an idle mode.

16. The method as claimed in claim 9, wherein the specific time is the time before the data is written to the selected memory block.

17. The method as claimed in claim 9, wherein the specific time is the time that the selected memory block is activated after a sleeping mode or an off state.

18. A phase change memory writing system, comprising:
   a phase change memory;
   a spare memory;
   a memory controller; and
   a counter counting an access number of a phase change memory, wherein the access number is the number of times that the phase change memory has been accessed,
   wherein the memory controller is configured to apply a memory refresh procedure to the phase change memory when the access number is larger than a predetermined number, the procedure comprising:
      copying and storing the data of the phase change memory to the spare memory;
      inputting a reset current to the phase change memory; and
      copying and storing the data from the spare memory to the phase change memory.

19. The system as claimed in claim 18, wherein the phase change memory comprises a plurality of memory blocks.

20. The system as claimed in claim 19, wherein the spare memory comprises part of the memory blocks.

21. The system as claimed in claim 18, wherein when the phase change memory is activated, the memory controller refreshes the phase change memory.

22. The system as claimed in claim 18, wherein the access number is set to zero after the phase change memory is refreshed.

* * * * *